(12) United States Patent
Brun et al.

(10) Patent No.: US 10,264,682 B2
(45) Date of Patent: Apr. 16, 2019

(54) METHOD FOR ASSEMBLING A MICROELECTRONIC CHIP DEVICE IN A FABRIC, CHIP DEVICE, AND FABRIC INCORPORATING A CRIMPED CHIP DEVICE

(75) Inventors: Jean Brun, Champagnier (FR);
Delphine Christophe, Thurins (FR);
Lionel Tenchine, Coublevie (FR)

(73) Assignees: COMMISSARIAT A L'ENERGIE ATOMIQUE ET AUX ENERGIES ALTERNATIVES, Paris (FR); POLE EUROPEEN DE PLASTURGIE, Bellignat (FR)

( * ) Notice: Subject to any disclaimer, the term of this patent is extended or adjusted under 35 U.S.C. 154(b) by 1144 days.

(21) Appl. No.: 14/235,358

(22) PCT Filed: Apr. 24, 2012

(86) PCT No.: PCT/EP2012/057490
§ 371 (c)(1),
(2), (4) Date: May 24, 2014

(87) PCT Pub. No.: WO2013/013843
PCT Pub. Date: Jan. 31, 2013

(65) Prior Publication Data
US 2014/0313743 A1    Oct. 23, 2014

(30) Foreign Application Priority Data

Jul. 28, 2011    (FR) ...................................... 11 02372
Nov. 16, 2011    (FR) ...................................... 11 03487

(51) Int. Cl.
*F21V 19/00*    (2006.01)
*H05K 1/02*    (2006.01)
(Continued)

(52) U.S. Cl.
CPC ............. *H05K 3/00* (2013.01); *F21V 19/004* (2013.01); *H01L 23/49811* (2013.01);
(Continued)

(58) Field of Classification Search
CPC ............. H05K 1/038; H05K 2201/029; H05K 2201/10106; H05K 2201/10825; H05K 2203/1446; H05K 3/301; H05K 3/321
(Continued)

(56) References Cited

U.S. PATENT DOCUMENTS 6,642,467 B2 * 11/2003 Farringdon ............ A41D 1/002
2/905
8,259,460 B2    9/2012 Bhattacharya et al.
(Continued)

FOREIGN PATENT DOCUMENTS

CN    101384186 A    3/2009
EP    2 107 642 A    10/2009
(Continued)

OTHER PUBLICATIONS

Notice of Reasons for Rejection from Japanese Patent Office for corresponding Japanese application 2014-522001 dated Jan. 5, 2016, English translation.
(Continued)

*Primary Examiner* — William J Carter
(74) *Attorney, Agent, or Firm* — Haug Partners LLP

(57) ABSTRACT

The method for assembling a microelectronic chip device (101) in a fabric (104) comprises the following steps: providing a microelectronic chip device (101) comprising a base (102) and a protruding element (103) rising from a face of the base (102), said protruding element (103) comprising a free end opposite the base (102); inserting into the fabric (104) the chip device (101) by the free end of the protruding element; deforming the protruding element (105) at its free
(Continued)

end so as to ensure the securing of the chip device (101) with the fabric (104) by forming a crimping bead (106).

16 Claims, 8 Drawing Sheets

(51) Int. Cl.
| | | |
|---|---|---|
| H05K 3/00 | (2006.01) | |
| H01L 23/498 | (2006.01) | |
| H05K 1/03 | (2006.01) | |
| H05K 1/18 | (2006.01) | |
| H05K 3/30 | (2006.01) | |
| H05K 3/32 | (2006.01) | |

(52) U.S. Cl.
CPC ............ *H05K 1/038* (2013.01); *H05K 1/189* (2013.01); *H01L 2924/0002* (2013.01); *H05K 1/028* (2013.01); *H05K 1/0393* (2013.01); *H05K 3/30* (2013.01); *H05K 3/32* (2013.01); *H05K 3/321* (2013.01); *H05K 2201/0129* (2013.01); *H05K 2203/0278* (2013.01); *Y10T 29/49117* (2015.01)

(58) Field of Classification Search
USPC .......................................................... 362/103
See application file for complete search history.

(56) References Cited

U.S. PATENT DOCUMENTS

| | | |
|---|---|---|
| 2003/0199160 A1 | 10/2003 | Farnworth et al. |
| 2009/0025819 A1 | 1/2009 | Douglas |
| 2009/0089978 A1 | 4/2009 | Sugihara et al. |
| 2010/0238637 A1* | 9/2010 | Bhattacharya ......... H05K 3/301 361/760 |
| 2011/1010068 | 5/2011 | Bhattacharya et al. |

FOREIGN PATENT DOCUMENTS

| | | |
|---|---|---|
| JP | 2008-142360 A | 6/2008 |
| JP | 2009-090122 A | 4/2009 |
| JP | 2009-540559 A | 11/2009 |
| WO | WO 2003/052875 A1 | 6/2003 |
| WO | WO 2007/093947 A1 | 8/2007 |
| WO | WO 2008/025889 A | 3/2008 |
| WO | WO 2011/007452 A | 1/2011 |

OTHER PUBLICATIONS

Office Action issued in corresponding Chinese Application No. 201280045304.9 dated Jan. 26, 2017 and its English Translation.

* cited by examiner

METHOD FOR ASSEMBLING A MICROELECTRONIC CHIP DEVICE IN A FABRIC, CHIP DEVICE, AND FABRIC INCORPORATING A CRIMPED CHIP DEVICE

This application is a 371 of PCT/EP2012/057490 filed on Apr. 24, 2012, published on Jan. 31, 2013 under publication number WO 2013/013843, which claims priority benefits from French Patent Application Number 1102372 filed Jul. 28, 2011 and French Patent Application Number 1103487 filed Nov. 16, 2011, the disclosures of which are incorporated herein by reference.

TECHNICAL FIELD OF THE INVENTION

The invention relates to a method for assembling a microelectronic chip device in a fabric.

STATE OF THE ART

Numerous techniques currently exist for mechanically and electrically connecting microelectronic chips together. One conventional technique consists, once the chips are formed on a substrate, and freed up by sawing, in producing a rigid mechanical connection between the chips. The chips, then fixed on a rigid support, are then electrically connected before a protection coating is formed. This approach, consisting in producing the connection on a rigid support, is conventionally used when there is a high degree of complexity in the connection of the chips. However, the main drawback of the latter is that it uses a rigid mechanical support which is particularly ill-suited to integration in flexible structures.

The document WO2008/025889 from the applicant describes, as FIG. 1 illustrates, a microelectronic chip comprising two parallel main faces 1, 2 and lateral faces 3a, 3b linking the main faces 1, 2. Each of the lateral faces 3a, 3b comprises a groove 4, provided with an electrical connection element (not represented), and forming a receptacle for a thread element 5 having an axis parallel to the longitudinal axis of the groove 4. The electrical connection element is produced by metallization of the groove 4.

The thread element 5, whose axis is parallel to the longitudinal axis of the groove 4, can be securely attached to the groove 4 by soldering with the addition of material, by electrolysis, by bonding, or by embedding. These secure attachment methods are complex to implement given the small size of the chip devices.

The pairs of threads thus provided with chip devices can then be woven with other threads to form a fabric. This entails certain precautions in the handling during the weaving, in order to avoid tearing the chip devices.

SUMMARY OF THE INVENTION

The aim is thus to incorporate, in a simple manner, electronic chip devices in a fabric without demanding precautions during the weaving. For this, the aim is, in particular, to produce a chip device which can be incorporated easily in a finished fabric.

This requirement is satisfied using the following steps:
providing a microelectronic chip device comprising a base and a protruding element rising from a face of the base, said protruding element comprising a free end opposite the base,
inserting into the fabric, from a face of the fabric, the chip device by the free end of the protruding element,
deforming the protruding element at its free end so as to form a crimping bead in order to ensure that the chip device is secured with the fabric after deformation.

According to one implementation, the chip device comprises an electrical connection terminal linked to the chip, and the fabric comprises an electrically conductive thread, said electrically conductive thread being brought into electrical contact with the connection terminal upon the insertion of the chip device into the fabric, and being held in contact with the connection terminal following the step of deformation of the protruding element.

Advantageously, the deformation step is performed by transferring, on either side of the chip device, two plates for applying, via these plates, an axial compression force on the protruding element between its free end and its junction with the base.

According to a variant, the protruding element is formed, at least at its free end, by a thermodeformable material, and one of the plates is placed in contact with the free end of the protruding element, or in contact with a fabric face separated from the free end by a portion of fabric, in order to heat said free end during the deformation step. The other plate can be placed in contact with the base on a face of the base opposite the face of the base from which rises the protruding element, this other plate being cooled during the deformation step.

According to one embodiment, the fabric comprises two substantially parallel electrically conductive threads, and the protruding element has a penetrating form, along an axis at right angles to the plane of the base, defined at least by the free end of the protruding element having a dimension less than the spacing of the threads, the step of insertion of the chip device into the fabric comprising the following sub-steps:
placing the free end of the protruding element between the two threads,
moving the chip device between the two threads with the result that the threads are spaced apart by the penetrating form of the protruding element,
continuing to move the chip device until the two threads each come into electrical contact with an associated connection terminal of the chip device.

According to one implementation, the form of the protruding element is tapered, and the protruding element comprises a twin-thread threading, the method comprising, during the insertion step, the following steps:
engaging the threads with two threads of the fabric, and applying a screwing motion to the chip device.

Advantageously, the deformation step comprises:
the securing of the chip device whose protruding element passes through the fabric,
the deformation by ultrasound means of the free end of the protruding element.

Advantageously, the chip device comprises an electrical connection terminal linked to the chip, and the fabric comprises an electrically conductive thread, said method comprising a step of interposition of a polymer intended to ensure an electrical contact between the thread and the electrical connection terminal. Consequently, according to a variant, the polymer can comprise electrically conductive particles, and the method can comprise: a step of stressing of the thread against the electrical connection terminal to clamp at least one particle, or one agglomerate of particles, between the connection terminal and the thread; and a step of solidification of the polymer to ensure mechanical hold between the thread, the solidified polymer and the connection terminal.

The chip device can be a light-emitting diode configured to emit light through the apex of the crimping bead, and in this case the deformation step comprises a step of shaping of the crimping bead in an optical lens form.

The invention also relates to a chip device comprising a base from which rises a protruding element, the protruding element has a free end opposite the base, and the protruding element is formed, at least at its free end, by a thermoplastic or thermoset polymer, or by a material whose melting point is between 70° C. and 320° C.

According to a variant, the device comprises at least one connection terminal formed in the protruding element.

The invention also relates to a fabric comprising at least one chip device crimped in the fabric by a crimping bead. The fabric can be seal-tight, and, on the chip device, the tightness is guaranteed at least partially by the crimping bead.

Furthermore, the fabric can comprise a chip device provided with a light-emitting diode, and the crimping bead can be configured in such a way as to form an optical lens through which the light from the light-emitting diode is emitted.

BRIEF DESCRIPTION OF THE DRAWINGS

Other advantages and features will become more clearly apparent from the following description of particular embodiments of the invention, given as nonlimiting examples and represented in the appended drawings, in which.

DESCRIPTION OF PARTICULAR EMBODIMENTS

As previously indicated, the aim is to produce a microelectronic chip device which can easily be incorporated in a fabric. In other words, there will be no need to securely attach the chip devices to threads which will then be used to weave, or form, the so-called "finished" fabric.

As a general rule, a fabric is formed by warp threads that are substantially parallel to one another, and by weft threads that are substantially parallel to one another and cross the warp threads. Two consecutive warp threads and two consecutive weft threads form a mesh which is more often than not in the general form of a parallelogram, and this mesh delimits a free space. Obviously, other types of fabrics and meshes can be envisaged. In practice, the fabric can be woven (warp and weft threads), or non-woven (agglomerate of compressed fibres or threads securely attached to one another).

Figure 1:
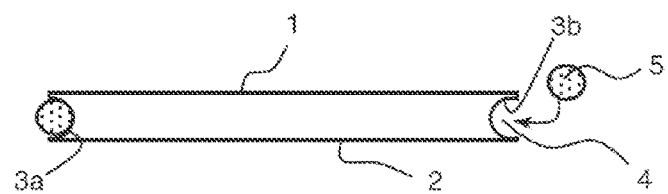
FIG. 1 illustrates a chip according to the prior art.
Figure 2:
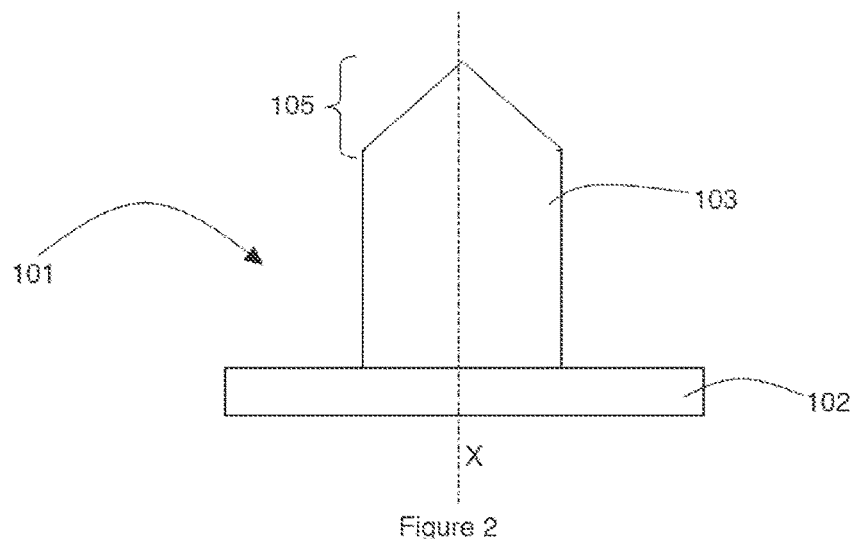
FIG. 2 illustrates an embodiment of a chip device seen from the side.

In FIG. 2, a microelectronic chip device 101 (hereinafter identified as chip device) comprises a base 102 and a protruding element 103 rising from a face of the base 102. Preferentially, a part of the protruding element 103 has a penetrating profile, for example in the form of a spike, intended to facilitate its insertion into the free space of a mesh of a fabric, and to spread the threads forming the mesh under a pressure exerted on the chip device 101. The protruding element 103 comprises a free end 105 opposite the base 102. Between the end of the protruding element 103 in contact with the base 102 and the opposite free end 105, an axial direction X of the protruding element 103 is defined. Preferentially, in this axial direction X, starting from the base 102, either the dimensions of the section of the protruding element 103, in a plane at right angles to the axis X, are constant (the protruding element 103 then forms a cylinder), or they converge toward the top of the free end 105. In fact, in the context of a mesh, if the insertion of the chip device is to be favoured, the top of the free end of the protruding element 103 has smaller dimensions than those of the mesh. To favour the contact of the threads of the mesh with the chip device 101, at least a part of the protruding element 103 intended for said contact of the protruding element 103 with said threads has dimensions greater than the spacing of the threads defining the mesh.

Figure 3:
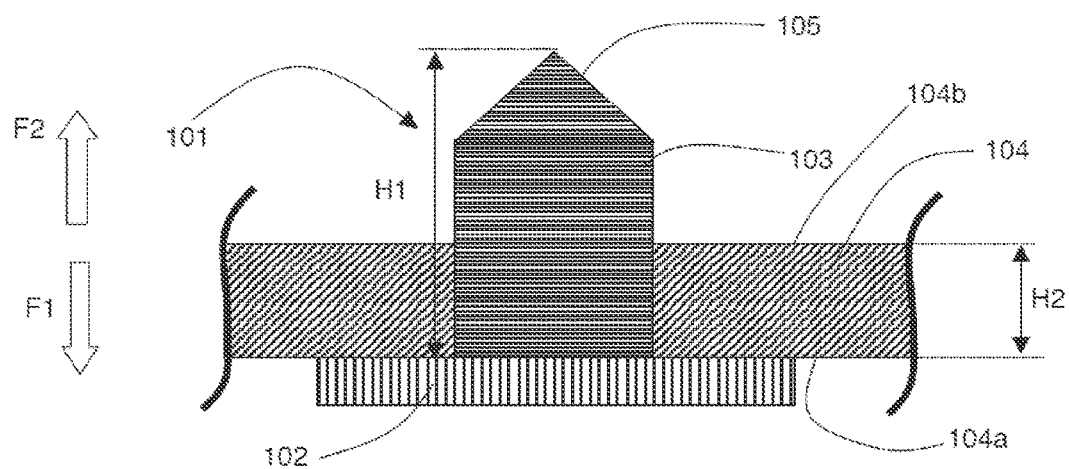
FIG. 3 illustrates a cross-sectional view of the chip device of FIG. 2 inserted into a fabric.

In FIG. 3, the chip device 101 has been inserted, during a step of the assembly method, by the free end 105 of the protruding element 103 into a fabric 104. This insertion has been performed through a face 104a of the fabric 104. Preferably, the insertion is performed until the base 102 comes into contact with the insertion face 104a of the fabric 104. Preferentially, in order to avoid the deformation of the fabric 104 during the insertion of a chip device 101 through a face 104a of a fabric 104, a plate is transferred, before the insertion, to a face 104b of the fabric opposite the insertion face 104a. Once the insertion is finished, this plate can be removed. In the example of FIG. 3, the protruding element 103 passes through the fabric 104, that is to say that the height H1 of the protruding element 103 is greater than the height H2 of the fabric 104. Consequently, if the abovementioned plate is used, it can include an opening to allow for the passage of the protruding element 103, or be flexible enough to be locally deformed by the spike. The result of such insertion is that the chip device 101 risks, from a pulling force F1 opposing the force F2 required for its insertion, being separated from the fabric. Consequently, there is a resulting need to secure the assembly between the fabric 104 and the chip device 101.

Figure 4:
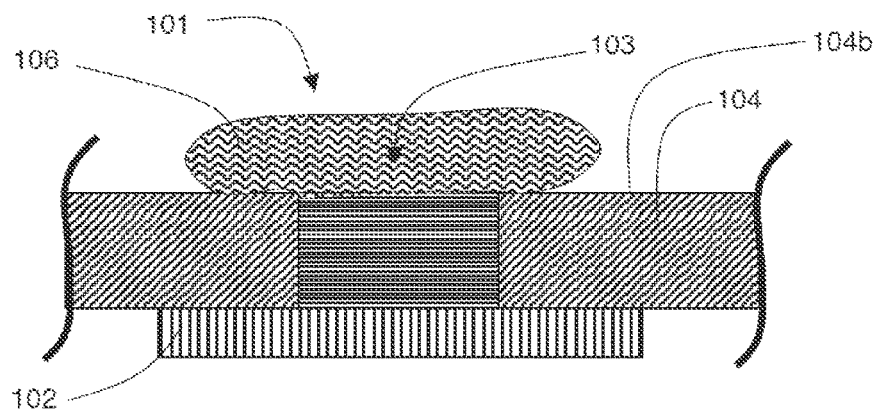
FIG. 4 illustrates the chip device of FIG. 2 crimped in with the fabric.

In FIG. 4, this need has been satisfied by providing, after insertion, for the protruding element 103 to be deformed at its free end 105 (FIG. 3) so as to ensure the securing of the chip device 101 with the fabric 104 after deformation. In the particular example of FIG. 4, the constituent material of the protruding element 103 is deformed (for example by creep) so as to generate a crimping bead 106 on the outer surface 104b of the fabric 104 preventing the removal of the chip device 101. In other words, the fabric 104 is locally sandwiched between the bead 106 and the base 102.

Figure 5:
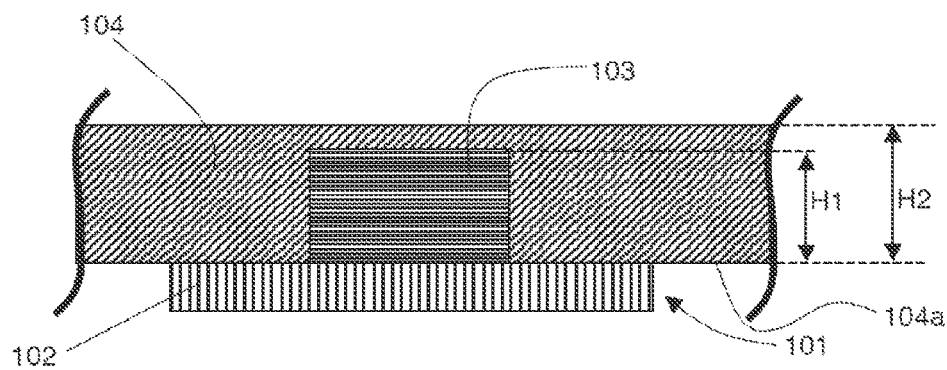
FIG. 5 illustrates a variant of the embodiment of FIG. 3.
Figure 6:
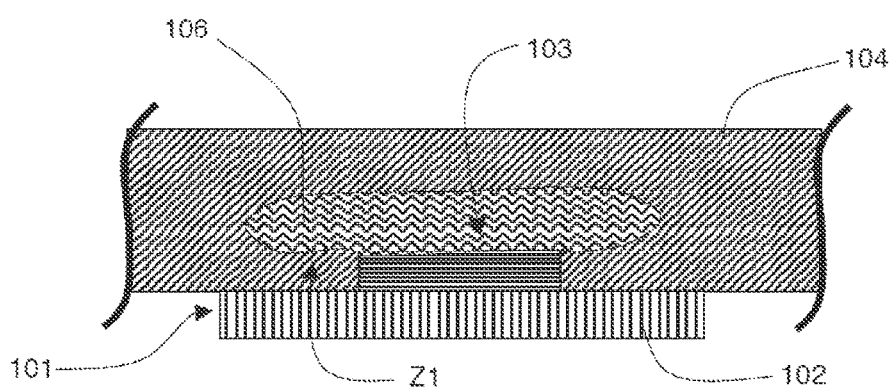
FIG. 6 illustrates the crimping of the variant of FIG. 5.

According to a variant embodiment illustrated in FIG. 5, during the insertion of the chip device 101 into the fabric 104, the protruding element 103 does not pass through the fabric 104, even when, preferentially, the base 102 is in contact with the insertion face 104*a*. In other words, the height H1 of the protruding element 103 is less than the thickness H2 of the fabric 104. In this case, if the plate mentioned above is to be used to avoid the deformation of the fabric 104 during the insertion, the latter does not need to be open. In FIG. 5, the free end of the protruding element is not in the form of a spike, but the spike-form variant can be implemented. In FIG. 6, the deformation of the protruding element 103 makes it possible, for example by creep, to form a crimping bead 106 in the fabric 104, thus generating an attachment between the threads, or fibres, of the fabric and the chip device 101. Thus, a portion of the fabric 104 is sandwiched heightwise between the bead 106 and the base 102 in at least one area Z1. Preferentially, when the material creeps in the fabric (FIG. 6) or over the fabric (FIG. 4), the fibres or threads of the fabric in contact with the bead 106 are bonded to said bead 106, thus enhancing the anti-extraction phenomenon so as to ensure an enhanced securing of the chip device with the fabric.

Thus, it will be understood that, generally, the step of deformation of the protruding element 103 at its free end 105 makes it possible to form a crimping bead in order to ensure the securing of the chip device 101 with the fabric 104 after deformation.

Figure 7:
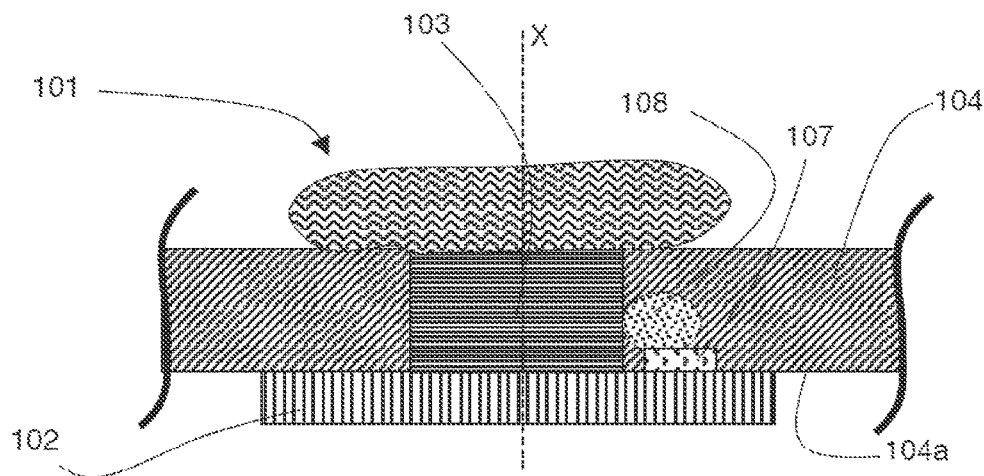
FIG. 7 illustrates a variant of a chip device equipped with a connection terminal, placed in a fabric.

In FIG. 7, advantageously, the chip device 101 comprises an electrical connection terminal 107 linked to an active area of the chip device 101. "Active area" should be understood to mean the chip with which the chip device 101 is equipped. In the particular example of FIG. 7, the active area can be the base 102. The fabric 104 includes an electrically conductive thread 108, said electrically conductive thread 108 being brought into electrical contact with the terminal 107 in the step of insertion of the chip device 101 into the fabric 104. This contact is then maintained following the step of deformation of the protruding element 103, for example by a pressure on the fabric provided by the bead 106 and the base 102.

In fact, in most applications, there will be a desire to connect the chip device to other chip devices, to a data bus, to an electrical power supply, to an antenna, etc.; the use of connection terminals and of electrically conductive threads makes it possible to satisfy these requirements.

Preferably, an electrical connection terminal 107 is situated on the base 102 on the face bearing the protruding element 103 (FIG. 7), or on, even in, the protruding element 103 itself. Examples will be described in more detail hereinbelow.

Figure 8:
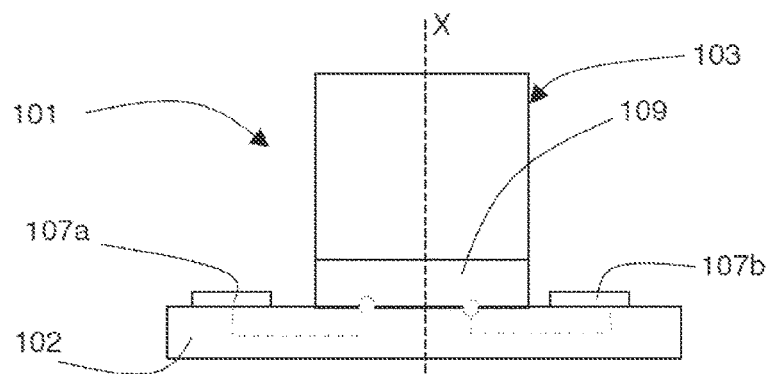
FIGS. 8 to 12 illustrate variant embodiments of chip devices.

In FIG. 8, the chip device 101 comprises two connection terminals 107*a*, 107*b* in the form of bump arranged on the base 102 on either side of the protruding element 103. The chip 109 forms part of the protruding element 103, and is linked to these terminals 107*a*, 107*b* by an electrical circuit (represented by dotted lines) formed in the base 102. The chip 109 could also be included in the base 102 as in the example of FIG. 7.

In a manner applicable to FIGS. 7 and 8, the chip device 101 comprises at least one connection terminal.

Preferentially, the protruding element rises from the base, leaving all around its junction with the base a free surface of the base. In other words, after deformation, the protruding element forms a mushroom. This shape makes it possible, for example, for the chip device to comprise four connection terminals distributed on the base around the protruding element (preferentially these four terminals are arranged at four cardinal points), so as to electrically and distinctly connect four electrically conductive threads forming a mesh in which the protruding element is inserted. The four threads are then held in contact with their associated terminals by a mechanical clamping between the mushroom-forming crimping bead and the base.

Figure 9:
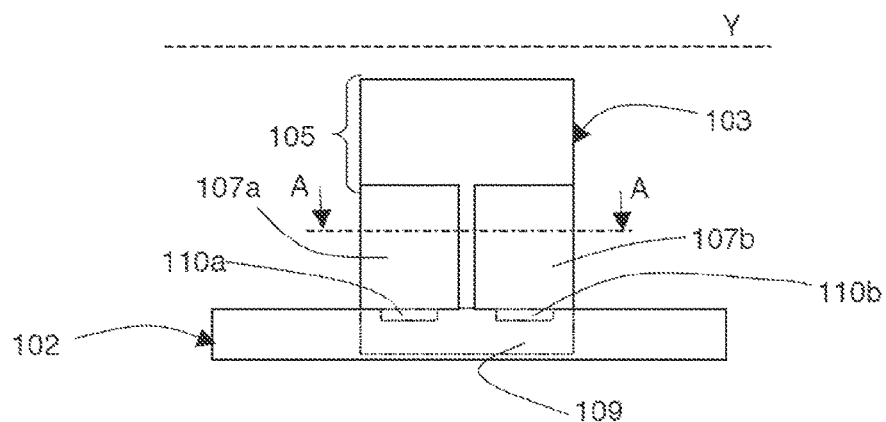

In FIG. 9, the chip 109 is formed in the base 102, or can be formed by the base 102 (in this example, the chip could also be mounted protruding on the base and partly forming the protruding element 103), and two distinct connection terminals 107*a*, 107*b* are formed by associated portions of the protruding element 103. In other words, at least one connection terminal is formed in the protruding element. The portions are respectively in electrical contact with contact take-up areas 110*a*, 110*b* of the chip 109. The mode of FIG. 9 advantageously makes it possible to place two electrically conductive threads of a fabric 104 in contact with the chip 109 when the device is inserted into the fabric. In order to ensure a good electrical contact, the separation between two adjacent threads will be configured so that the two threads grip the protruding element 103 at the level of the terminals 107*a*, 107*b* after insertion. The two threads are then spaced apart in a staggered manner along the axis Y. Obviously, for the requirements of the method, these terminals 107*a* and 107*b* are topped by a deformable area forming the free end 105. This deformable area can be formed by bonding a ductile spike (not represented). The terminals 107*a*, 107*b* can be produced by photo-masking and electrolysis of copper or of its alloy, or even of any other readily electrically conductive material that can be deposited in a thick layer.

Figure 10:
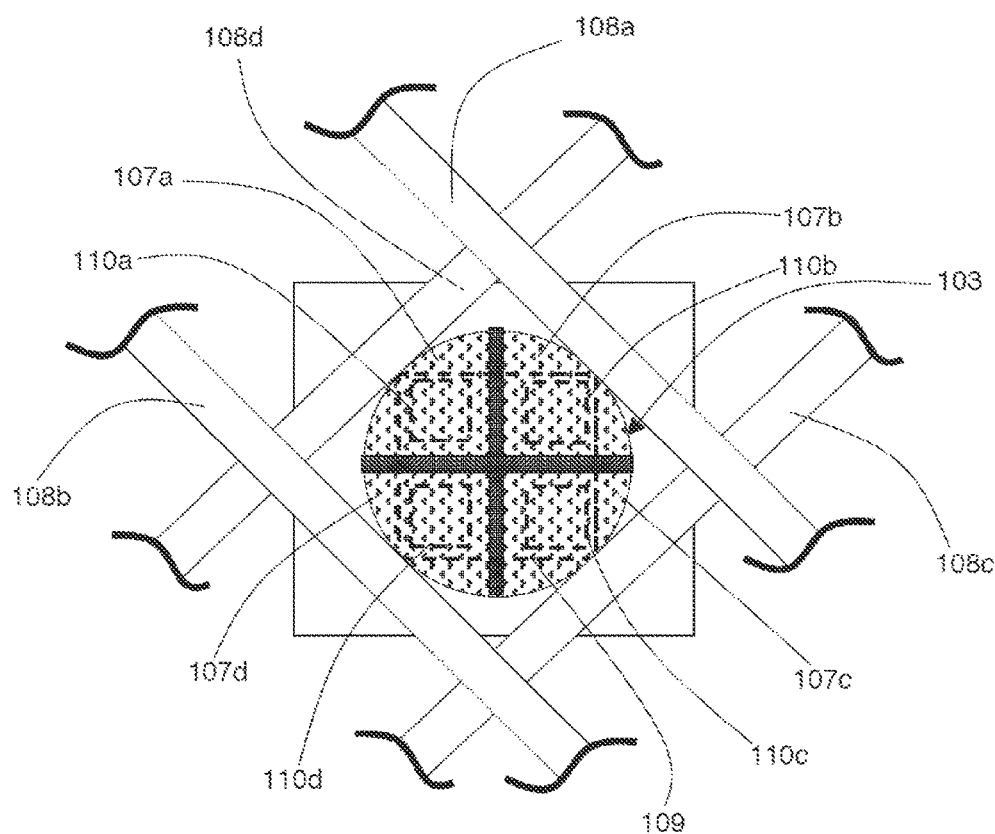

According to a variant of FIG. 9 illustrated in FIG. 10 representing a cross-sectional view equivalent to the cross section along A-A of FIG. 9, the protruding element 103 comprises four portions delimiting four associated connection terminals 107*a*, 107*b*, 107*c*, 107*d* (preferentially electrically insulated from one another), each of these portions is in electrical contact with an associated contact take-up area 110*a*, 110*b*, 110*c*, 110*d* of the chip 109. This chip device variant is advantageously inserted into the free space of a mesh of woven fabric. The four threads 108*a*, 108*b*, 108*c*, 108*d* defining the mesh are electrically conductive. The method then includes the insertion of the protruding element 103 into the mesh, between the four threads 108*a*, 108*b*, 108*c*, 108*d* defining it, so that each thread 108*a*, 108*b*, 108*c*, 108*d* of the mesh is in electrical contact with an associated terminal 107*a*, 107*b*, 107*c*, 107*d* after the insertion. In order to ensure the electrical contact of the threads with the terminals 107*a*, 107*b*, 107*c*, 107*d*, the spacing between two consecutive warp 108*a*, 108*b*, or weft 108*c*, 108*d*, threads is less than the distance separating two opposing associated contact areas between the threads and the terminals.

In the example of FIG. 10, the protruding element 103 has a circular section, the spacing between two consecutive warp, or weft, threads is less than the diameter of the protruding element 103. In other words, the threads 108*a*, 108*b*, 108*c*, 108*d* of the mesh are all stressed against the protruding element 103 and in contact therewith.

Figure 11:
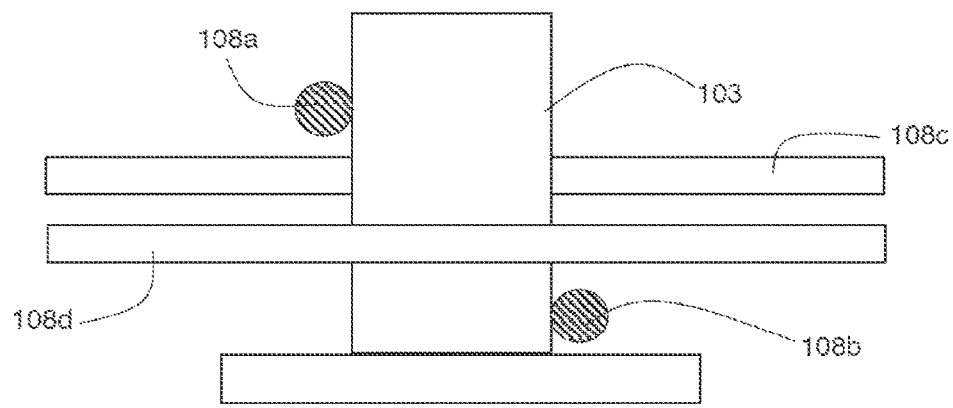

According to a side view variant of FIG. 10 illustrated in FIG. 11, the fabric can have a significant thickness, and warp and weft threads of different meshes can be stacked one on top of the other. Thus, it is possible for the four electrically conductive threads defined in FIG. 10 to originate from different meshes of different levels. In FIG. 11, only the electrically conductive threads 108a, 108b, 108c, 108d are represented. These threads 108a, 108b, 108c, 108d are each stressed in electrical contact with associated terminals that are not represented of the protruding element 103 before deformation.

Figure 12:
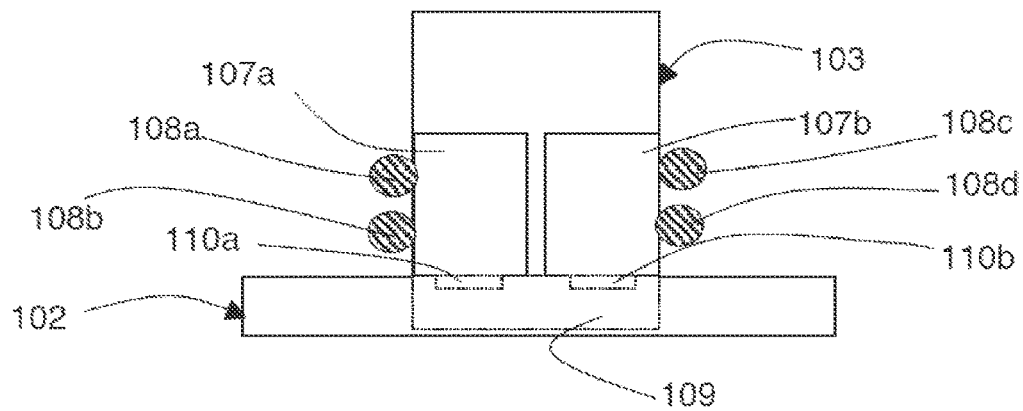

In FIG. 12, which is a variant of FIG. 9 for which the same references designate the same elements, similar connection terminals 107a, 107b can be electrically associated with a plurality of electrically conductive threads 108a, 108b, 108c, 108d. Thus, in this FIG. 12, the threads 108a and 108b are in electrical contact with the connection terminal 107a and the threads 108c, 108d are in electrical contact with the terminal 107b. This makes it possible to increase the reliability of the assembly by electrical connection redundancy. This principle can also be applied to other embodiments and variants described above.

According to a variant (not represented), the protruding element can have a plurality of connection terminals spaced apart from one another in the height of the protruding element. In fact, the protruding element can be structured by using a multilayer PCB with certain electrically conductive tracks interlinked so as to create a plurality of connection terminals staggered along the protruding element in its axial direction. Consequently, according to this variant, the threads 108a, 108b, 108c, 108d of FIG. 12 could each be associated with a distinct connection terminal.

Preferably, when a connection terminal is situated on the face of the base 102 at the level from which the protruding element 103 rises (embodiments of FIGS. 7 and 8), the connection terminal 107 associated with the deformed protruding element makes it possible to generate a mechanical clamping to maintain the electrical contact between the associated thread and the connection terminal on the axis X. In other words, the corresponding electrically conductive thread is kept in electrical contact with the associated terminal by virtue of a compression of the fabric between the bead 106 and the base 102. When a terminal is formed on the base, the fabric is preferentially woven, or arranged, so that the electrically conductive thread intended to cooperate with the associated terminal is arranged on the outer face 104a of the fabric through which the chip device will be inserted. This facilitates the electrical contact of a thread with its associated terminal while avoiding the interposition of threads or of fibres of the fabric which could hamper the electrical contact.

Preferably, when the terminal is situated on the protruding element (FIG. 9) the associated electrically conductive thread is maintained in electrical contact by virtue of the density of the fabric which maintains this contact. In the context of a mesh, it will be said that two parallel consecutive threads grip the protruding element, at least one of the two threads being electrically conductive and then being able to be in electrical contact with an associated connection terminal. In this case, an electrically conductive thread of the fabric intended to come into contact with the terminal can be on the surface of the fabric or surrounded by other threads in the fabric. In the case where the electrically conductive thread is on the surface of the face of the fabric opposite the face of the fabric in contact with the base, the securing of the electrically conductive thread against its connection terminal can also be produced by the crimping bead which has at least partially crept around said electrically conductive thread during its deformation.

Figure 13:
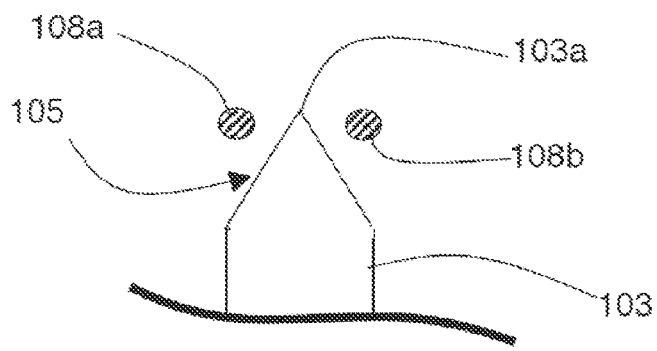
FIGS. 13 and 14 schematically illustrate the step of insertion of a chip device in a fabric.
Figure 14:
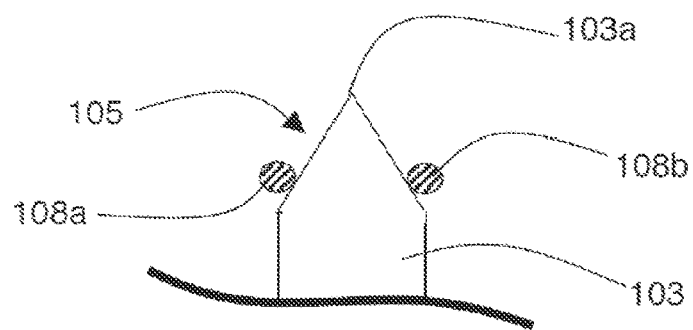

As stated above, the protruding element can have a penetrating form, along the axis X at right angles to the plane of the base, defined at least by its free end. This penetrating form is advantageous notably for facilitating the insertion of the chip device into a fabric comprising two electrically conductive and substantially parallel threads. Thus, the free end of the protruding element has a dimension less than the spacing between the two threads. FIGS. 13 and 14 partially illustrate the free end 105 of the protruding element 103 and the behaviour of two threads 108a, 108b of the fabric (for the reasons of clarity, only two parallel threads of the fabric are represented). In FIG. 13, upon the insertion of the free end 105 of the protruding element 103, preferably spiked, the latter is offered up to the fabric to be placed between the two threads 108a, 108b. Then (FIG. 14), the chip device is moved between the two electrically conductive threads 108a, 108b so that they are separated by the penetrating form of the protruding element 103 on either side of its apex. In fact, the threads 108a, 108b bear along the body of the protruding element 103 on either side of its apex 103a then follow the outer surface of the body of the protruding element 103. The movement of the chip device is continued until the two threads 108a, 108b each come into electrical contact with an associated connection terminal of the chip device (step not represented). In the case where just one of these two parallel threads is electrically conductive, it comes into contact with its associated connection terminal, the two threads then make it possible to maintain the electrical contact.

In order to produce the function of the penetrating form of the protruding element, the latter can have a trapezoidal section, the base of the trapezium is connected to the base, whereas the apex of the trapezium forms the free end of the protruding element.

A person skilled in the art will be able to use any other form favouring the insertion of the free end of the protruding element into the fabric, for example a pyramid form, a truncated or non-truncated cone form, etc.

Figure 15:
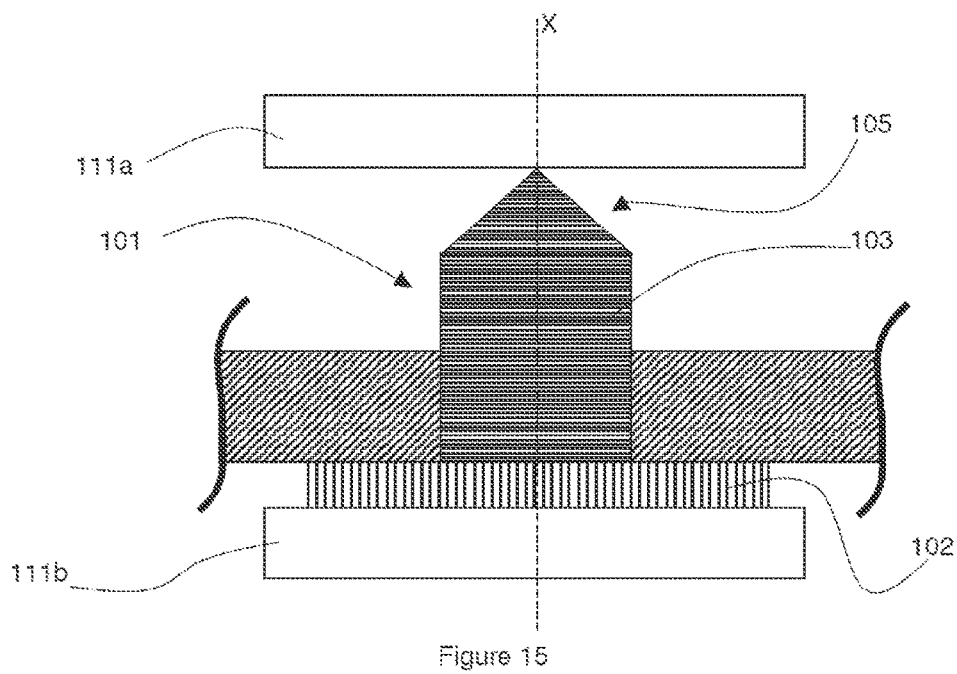
FIGS. 15 and 16 illustrate the step of deformation of the chip device to assemble it with the fabric from a cross-sectional view centred on the chip device.

According to a preferential implementation of the assembly method illustrated in FIG. 15, the deformation step is performed by transferring, on either side of the chip device 101, two plates 111a, 111b to apply, via these plates 111a, 111b, an axial compression force (according to axis X) to the protruding element 103 between its free end 105 and its junction with the base 102. Advantageously, a first plate 111a is placed in contact with the free end 105 of the protruding element 103, a second plate 111b can be placed in contact with the base 102. The plates can then be moved toward one another to deform the protruding element 103 and generate the crimping bead, for example by hot or cold deformation, or even by heat applied by ultrasound means.

The ultrasound means makes it possible to transform electrical oscillations into mechanical oscillations to heat up and locally melt the material forming the free end of the protruding element. The mechanical oscillations can be transmitted to said material using a sonotrode placed in contact with said free end which then causes it to heat up. It is implicit that the base is more resistant to deformation than the protruding element. In other words, generally, the deformation step can comprise the securing of the chip device, for example via the plate 11b, the protruding element 103 of which passes through the fabric 104, and the deformation by ultrasound means of the free end 105 of the protruding element 103, for example via the plate 111a.

Figure 16:
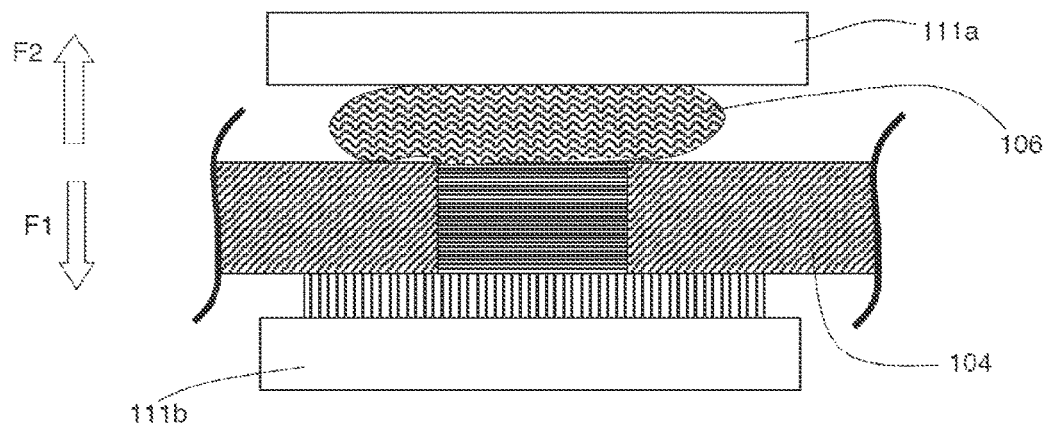

In order to favour the deformation of the protruding element 103, the latter is formed, at least at its free end 105, by a thermodeformable material (for example a thermoplastic or thermoset polymer). Consequently, the plate 111a in contact with the protruding element 103 can be heated in the deformation step to heat the free end of the protruding element 103 and favour its creep to generate a crimping bead 106 as illustrated in FIG. 16. In the case where the chip device does not pass through the fabric (embodiment of FIG. 5), it is possible to compress the two plates 111a, 111b so as to compress the fabric until the heating plate comes into contact with the free end 105. Obviously, with regard to the temperature applied, a person skilled in the art will choose the appropriate temperature as a function of the material forming the free end 105 of the protruding element 103.

The material used can be chosen from those in the table below:

| Polymer | Acronym | Tg (° C.) | Tm (° C.) |
|---|---|---|---|
| Cyclic Olefin Copolymer | COC | 70-155 | 190-320 |
| Polymethylmethacrylate | PMMA | 100-122 | 250-260 |
| Polycarbonate | PC | 145-148 | 260-270 |
| Polystyrene | PS | 92-100 | 240-260 | in which Tg represents the glass transition temperature, that is to say the material softening temperature, and Tm represents the melting point.

Advantageously, the protruding element (105) is formed, at least at its free end 105, by a material whose melting point is between 70° C. and 320° C.

In the exemplary embodiment where the protruding element does not pass through the fabric, the first plate can be placed in contact with a face of the fabric in a portion of fabric separating said face of the fabric from the free end of the protruding element. In this case, this fabric face is the one opposite the insertion face. The temperature of the heating plate can then be transmitted by the portion of fabric at the free end of the protruding element situated in the fabric.

According to an implementation taken in combination with the heating plate 111a, the plate 111b, placed in contact with the base (typically on the face of the base opposite the face where the protruding element 103 rises), is cooled during the deformation step. This implementation is advantageous notably when the protruding element 103 is entirely produced in one and the same thermodeformable material. In practice, in this particular case, the plate 111b makes it possible to maintain a part of the proximal protruding element 103 of the base at a temperature preventing its deformation so that only the free end 105 of the protruding element 103 is deformed. If the plate 111b is not cooled, the protruding element 103 will preferentially be produced in two parts, a proximal first part of the plate is then in a material more resistant to the deformation and to the heat than a second part of the protruding element situated in the extension of the first part and forming at least the free end of the protruding element 105. The materials targeted in the table above will be able to be chosen according to the criteria listed previously. These two parts of the protruding element can also have different mechanical properties in the case where the protruding element is deformed without having to heat it.

The chip device can be produced in two parts. A first part comprises the base including, or forming, the chip, or the base on which the chip is mounted (the chip then protrudes from the base). The second part then corresponds to the protruding element, or to a portion of the protruding element intended to form, with the chip mounted on the base, the protruding element. The second part can be obtained by injection of material into a suitable mould or by machining of a part. According to one implementation, the second part can be bonded to the first part. According to another implementation, the material intended to form the second part is positioned in a mould on which the first part is mounted so as to be in contact with the material. The material is then liquefied, for example by heating, then cooled so as to adhere to the first part and form a new assembly forming the chip device.

The chip device can comprise a light-emitting diode or offer any other type of function that can be produced by the chip. When the crimping bead is arranged on the outer surface of the fabric, it advantageously makes it possible to keep the fibres away from the apex of said bead. Thus, when the chip device comprises a diode, the latter can emit light through the apex of the crimping bead without the propagation of this light being hampered by the fibres of the fabric. In this case, the protruding element is transparent. Thus, by shrewdly placing a number of chip devices in a fabric, it is possible to produce precise patterns and power these chip devices by electrically conductive threads. It is also possible to insert devices of RFID type into a woven tape, the antennas of said devices then being produced by electrically conductive threads of the fabric, for example made of copper.

Figure 17:
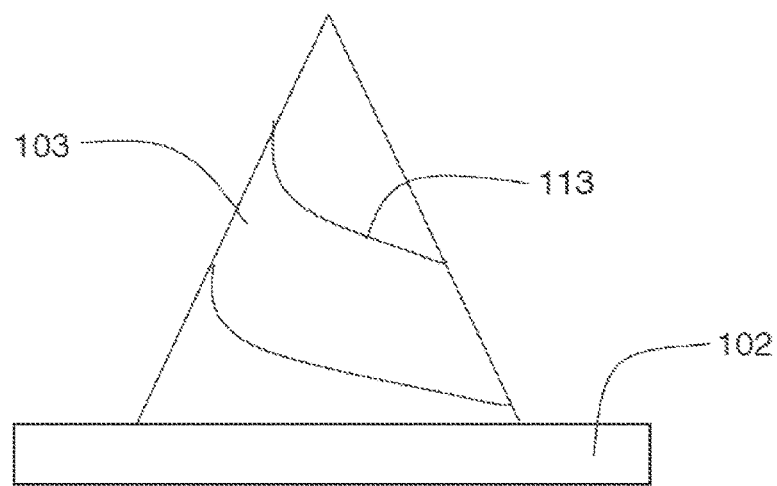
FIG. 17 illustrates a variant of a chip device used in the method.

According to a variant, illustrated in FIG. 17, the form of the protruding element 103 is tapered (truncated or not), and the protruding element 103 includes a threading with two threads 113. Thus, the insertion of the chip device into the fabric can be done by engaging the threads with two threads of the fabric (preferentially two parallel threads of one and the same mesh), and by applying a screwing motion to the chip device 101. The screwing can be done until the base 102 comes into contact with the fabric and/or, in the case where at least one of the two threads is electrically conductive, this electrically conductive thread comes into electrical contact with an associated connection terminal.

Figure 18:
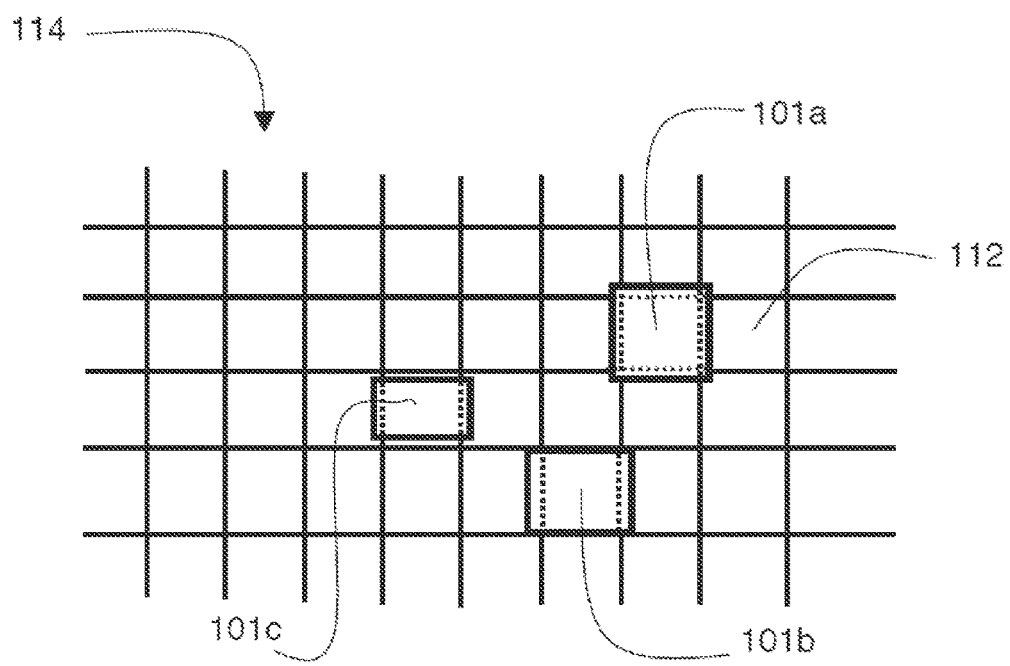
FIG. 18 illustrates a fabric equipped with three chip devices.

FIG. 18 illustrates a fabric 104 comprising a plurality of meshes 112. Three chip devices 101a, 101b, 101c are incorporated. The right-most chip device 101a is electrically linked to four threads of one and the same mesh. The other two chip devices 101b, 101c are each electrically linked to two mesh threads. In FIG. 18, weft threads and warp threads are represented at right angles and the pitches separating two parallel threads are represented as substantially equal so that the meshes are square. Obviously, the orientations of the threads and the warp and weft pitches can be any without that affecting the use of chip devices of dimensions and forms suited to the fabric. Generally, whether there is or is not an electrical connection, a fabric comprises at least one chip device crimped in said fabric, whether the crimping bead is outside the fabric or inside the fabric. By definition, the crimping is understood to mean fixing a piece onto another by folding back the rim of a first piece over the second or into voids of the second. In the present case, the first piece is the chip device and the second piece the fabric, the voids of the fabric are considered to be the free spaces of the meshes or between the fibres of the fabric and the rim is defined by at least a part of the protruding element.

Such devices can also be inserted into smart clothing in order to follow the movement of a person geographically and medically.

The chip devices can have dimensions less than 5 mm side, the thickness of the chip device once crimped to the fabric can be less than 200 μm. The devices can then be inserted into a fabric by using conventional machines for handling small objects. The method of insertion into a fabric can consequently be put in place inexpensively.

Numerous variants and modifications of embodiments described here will become apparent to a person skilled in the art. Prismatic, pyramidal and conical penetrating forms are described, but any other convex form may be suitable provided that they facilitate the penetration into the fabric.

As indicated previously, the role of the deformation is to maintain the assembly between the fabric and the chip device after deformation. According to an unrepresented variant, the chip device may comprise one or more grooves in which fibres or threads of the fabric can be housed during insertion, these grooves make it possible to improve the securing. The grooves can be formed in the protruding element or delimited by the protruding element and a portion of the base at the junction between the protruding element and the base.

Figure 19:
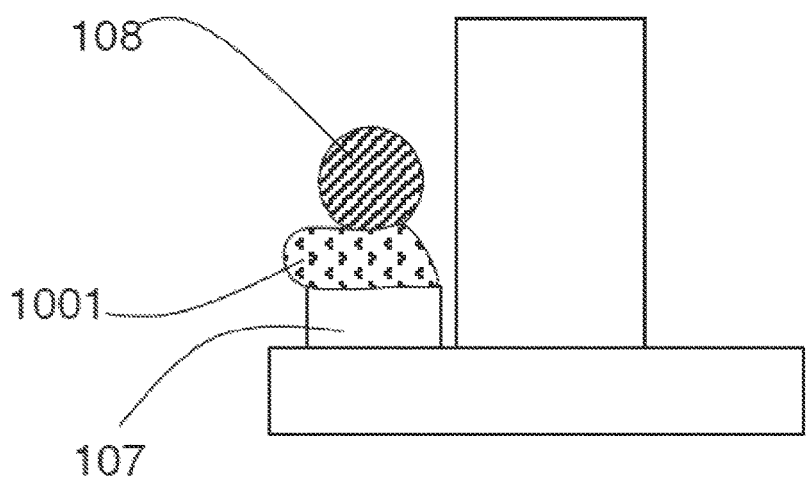
FIG. 19 illustrates a particular embodiment using a polymer.

According to a refinement applicable to all the embodiments, and illustrated schematically in FIG. 19, where the aim is to associate an electrically conductive thread 108 of the fabric with a connection terminal 107 linked to the chip of a chip device, a polymer 1001 can be interposed between the thread 108 and the connection terminal 107. Such a polymer 1001 is intended to ensure an electrical contact between said thread 108 and said terminal 107. This interposition is, preferably, produced before the insertion step.

According to one implementation, the polymer comprises electrically conductive particles. Consequently, the method may comprise the following steps:

a step of stressing of the thread 108 against the electrical connection terminal 107 to clamp at least one particle, or an agglomerate of particles, between the connection terminal 107 and the thread 108, and a step of solidification of the polymer 1001 to ensure a mechanical securing between the thread 108, the solidified polymer 1001 and the connection terminal 107, so as to ensure, after solidification, the electrical contact between the thread 108 and the terminal 107.

In other words, the polymer 1001 charged with particles is arranged at least at a connection terminal 107 and the associated thread 108 that is to be connected to said terminal. "At" should be understood to mean that at least a portion of the polymer 1001 is interposed between the thread 108 and the connection terminal 107.

The stress can be produced by a pressure applied by the thread 108 toward the terminal 107 or vice versa, to compress the portion of the polymer 1001 situated between the connection terminal 107 and the thread 108. The result of this pressure is that an electrical contact is made between the connection terminal 107 and the associated thread 108 via at least one particle. In fact, by designing the polymer, the particles are uniformly distributed but do not touch, the pressure allows for an accumulation of the particles so that statistically at least one particle or one agglomerate of particles is clamped. An agglomerate in fact corresponds to a plurality of particles in electrical contact with one another. Once the pressure is applied, the polymer is fixed, for example by baking, to maintain the assembly and the duly formed electrical contact between the thread and the associated connection terminal.

This refinement has the advantage of improving the electrical contact described above while improving the securing of the chip device in the fabric that is already partly ensured by the deformation of the protruding element.

Among the types of polymers that can be envisaged in the context of favouring an electrical contact, it is possible to use anisotropic conductive glues. The polymers will then be able to be of anisotropic conductive film (ACF) type, anisotropic conductive adhesive (ACA) type, isotropic conductive adhesive (ICA) type. The polymer can impregnate the fabric before or after the insertion of the protruding element of the chip device.

According to a particular embodiment, the polymer, once hardened, may be sufficient to secure the chip device with the fabric. In other words, the step of deformation of the protruding element is no longer necessary. In this case, if the chip device does not require electrical connection with the fabric, the polymer will be able to have a simple function of securing the assembly. Consequently, the method may comprise the following steps: providing a microelectronic chip device comprising a base and a protruding element rising from a face of the base, said protruding element comprising a free end opposite the base; inserting into the fabric, from a face of the fabric, the chip device via the free end of the protruding element; fixing, by the use of a polymer, the chip device with the fabric to ensure that the chip device is held in the fabric. The polymer can then be a simple glue. Obviously, this particular embodiment can be combined with the use of a polymer to ensure an electrical contact as defined above between, notably, an electrically thread of the fabric and an electrical connection terminal of the chip device, the only difference remaining to be that the deformation step is not performed.

It has been specified above how the chip device 101 was able to be incorporated in a fabric 104 so as to be crimped in the fabric by a crimping bead 106.

According to a particular implementation applicable to the different embodiments, the fabric 104 is a fabric that is impermeable to liquids, for example to water, notably rainwater. In fact, impermeable should be understood to mean that the fabric can, for example, form a tight bag which, when dipped in water, prevents the water from penetrating into the bag for example after 5 minutes of immersion in the water. The insertion of the chip device by its free end affects the fabric at the point of insertion. The result is therefore that, after the insertion step, the fabric is no longer locally impermeable, which risks creating an issue as to the tightness of the fabric. To resolve this issue, it is possible, after the step of deformation of the protruding element 105, to provide a step of sealing by the deposition of a material at the place where the fabric is affected so as to render the assembly of the chip device 101 with the fabric 104 tight. Advantageously, this material can also be deposited on the side of the interface of the base 102 with the fabric 104, this notably making it possible to avoid snags. Advantageously, this sealing step is performed concomitantly with the deformation step. For this, the material used to form the protruding element 105 makes it possible, after deformation, to produce the tightness of the assembly of the fabric 104 with the chip device 101. In other words, the deformation of the protruding element 105 at its free end makes it possible, after deformation, to ensure that the chip device 101 is held and ensure the tightness of the assembly. To produce the tightness of the fabric/chip device assembly, the step of deformation of the protruding element 105 will advantageously cause the protruding element 105 to creep, and advantageously melt, at least partially, such that the latter can, after deformation, coat the fabric 104 in the area of penetration of the chip device 101 into the fabric 104 so as to fill the interstices and alterations formed in the fabric 104 by the insertion step. According to a variant that can be taken into combination with what has been stated above, the face of the base opposite the fabric may also comprise a thermodeformable material (for example a thermoplastic or thermoset polymer), so that this material is also deformed to ensure the tightness at the interface of the base with the fabric.

In other words, the fabric may comprise at least one chip device crimped in the fabric by a crimping bead and, advantageously, it is a seal-tight fabric. In this case, in the place of the chip device, the tightness is guaranteed, totally or at least partially, by the crimping bead.

It has been specified previously that the chip device was able to comprise a light-emitting diode and could, after crimping, emit light through the apex of the bead resulting from the deformation step. In other words, the crimping bead 106 is configured in such a way as to form an optical lens through which the light from the light-emitting diode is emitted. Thus, advantageously, the deformation step comprises a step of conformation of a crimping bead in an optical lens form, for example in the form of a Fresnel lens. This conformation can be produced using a plate comprising an imprint into which the protruding element 105 creeps at least partially during the deformation step. This diode-based implementation can be combined with the issue of seal-tightness seen above.

Furthermore, the crimping bead 106 can also adopt any form making it possible to display a pattern or to present information. According to a particular example, the crimping bead 106 forms a dome whose base is defined by a circle of radius R, and this dome has a height H relative to the base of the dome such that the ratio H/R is between 0.7 and 1.3. The base of the dome is linked to the base at least by a residual portion of the protruding element. Such a ratio allows for a better diffusion of the light. Advantageously, the residual portion comprises, in a cross section (in a plane parallel to the plane comprising the base), an outer contour in the form of a circle, such that the diameter of said circle is substantially three times less than the diameter of the base of the dome.

It has also been specified above that the protruding element was able to be formed at least at its free end by a thermodeformable material. Consequently, generally, the deformation step can be carried out by heating said free end. Any heating device can then be implemented such as, for example, the plate(s) described previously.

In a variant in which the chip device comprises a groove, the deformation of the protruding element also makes it possible to fix the thread in a groove into which it has been inserted during the step of insertion of the chip device into the fabric.

The invention claimed is:

1. A method for assembling a microelectronic chip device in a fabric, wherein the method comprises the following steps:
    providing a microelectronic chip device comprising a base, a protruding element rising from a face of the base, and an electrical connection terminal arranged on the base that is separated and distinct from the protruding element, said protruding element comprising a free end opposite the base, and wherein no portion of the protruding element acts as an electrical connection element,
    inserting into the fabric, from a face of the fabric, the chip device by the free end of the protruding element, and
    deforming the protruding element at the free end so as to form a crimping bead in order to ensure that the chip device is secured with the fabric after deformation;
    wherein the fabric comprises an electrically conductive thread, said electrically conductive thread being brought into electrical contact with the connection terminal upon the insertion of the chip device into the fabric, and being held in contact with the connection terminal following the step of deformation of the protruding element.

2. The method according to claim 1, wherein the deformation step is performed by transferring, on either side of the chip device, two plates for applying, via the two plates, an axial compression force on the protruding element between the free end and a junction of the protruding element with the base.

3. The method according to claim 2, wherein the protruding element is formed, at least at its free end, by a theimo-deformable material, and one of the plates is placed in contact with the free end of the protruding element, or in contact with a fabric face separated from the free end by a portion of fabric, in order to heat said free end during the deformation step.

4. The method according to claim 3, wherein the other plate is placed in contact with the base on a face of the base opposite the face of the base from which rises the protruding element, the other plate being cooled during the deformation step.

5. The method according to claim 1, wherein the fabric comprises two substantially parallel electrically conductive threads, and the protruding element has a penetrating form, along an axis at right angles to the plane of the base, defined at least by the free end of the protruding element having a dimension less than the spacing of the threads, wherein the step of inserting of the chip device into the fabric comprising the following substeps:
    placing the free end of the protruding element between the two threads,
    moving the chip device between the two threads with the result that the threads are spaced apart by the penetrating form of the protruding element, and
    continuing to move the chip device until the two threads each come into electrical contact with an associated connection terminal of the chip device.

6. The method according to claim 1, wherein the form of the protruding element is tapered, and the protruding element comprises a twin-thread threading, the method comprising, during the insertion step, the following steps:
    engaging the threads with two threads of the fabric, and
    applying a screwing motion to the chip device.

7. The method according to claim 1, wherein the deformation step comprises:
    securing of the chip device whose protruding element passes through the fabric, and
    deforming, by ultrasound means, the free end of the protruding element.

8. The method according to claim 1, wherein the fabric comprises an electrically conductive thread, said method further comprising a step of interposing a polymer intended to ensure an electrical contact between the thread and the electrical connection terminal.

9. The method according to claim 8, wherein the polymer comprises electrically conductive particles, and the step of interposing comprises:
    a step of stressing of the thread against the electrical connection terminal to clamp at least one particle, or one agglomerate of particles, between the connection terminal and the thread, and
    and a step of solidification of the polymer to ensure mechanical hold between the thread, the solidified polymer, and the connection terminal.

10. The method according to claim 1, wherein, the chip device is a light-emitting diode configured to emit light through the apex of the crimping bead, wherein the deformation step comprises a step of shaping of the crimping bead in an optical lens form.

11. The method according to claim 1, wherein the step of deforming the protruding element so as to form a crimping bead prevents the removal of the chip device by locally sandwiching at least a portion of the fabric between the bead and the base.

12. A device, comprising:
a chip;
a base from which rises a protruding element; and
at least one electrical connection terminal arranged on the base that is separated and distinct from the protruding element,
wherein the protruding element has a free end opposite the base, and wherein no portion of the protruding element acts as an electrical connection element,
wherein the protruding element is formed, at least at the free end, by a thermoplastic or thermoset polymer, or by a material having melting point between 70° C. and 320° C., the protruding element being able to be deformed at the free end so as to form a crimping bead to ensure, after deformation, said device is secured with a fabric; wherein the fabric comprises an electrically conductive thread, said electrically conductive tread configured to be brought into electrical contact with the at least one electrical connection terminal upon insertion of said device into the fabric and held in contact with the at least one electrical connection terminal when said device is secured with the fabric.

13. A fabric comprising:
at least one chip device, wherein the chip device is crimped in the fabric by a crimping bead, wherein the chip devices comprises:
a chip;
a base from which rises a protruding element; and
at least one electrical connection terminal arranged on the base that is separated and distinct from the protruding element,
wherein no portion of the protruding element acts as an electrical connection element; wherein the fabric comprises an electrically conductive thread, said electrically conductive tread in electrical contact with the at least one electrical connection terminal and held in contact with the at least one electrical connection terminal.

14. The fabric according to claim 13, wherein the fabric is a seal-tight fabric, and, wherein on the chip device, the tightness is guaranteed at least partially by the crimping bead.

15. The fabric according to claim 13, wherein the chip device further comprises a light-emitting diode, and wherein the crimping bead is configured to form an optical lens through which the light from the light-emitting diode is emitted.

16. A method for assembling a microelectronic chip device in a fabric, the method comprises the following steps:
providing a microelectronic chip device comprising a base, a protruding element rising from a face of the base, and an electrical connection terminal arranged on the base that is separated and distinct from the protruding element, said protruding element comprising a free end opposite the base, and wherein no portion of the protruding element acts as an electrical connection element,
inserting into the fabric, from an insertion face of the fabric, the chip device by the free end of the protruding element,
deforming the protruding element at the free end so as to form a crimping bead on an outer surface of the fabric or in the fabric in order to ensure that the chip device is secured with the fabric after deformation; wherein the fabric comprises an electrically conductive thread, said electrically conductive thread being brought into electrical contact with the connection terminal upon the insertion of the chip device into the fabric, and being held in contact with the connection terminal following the step of deformation of the protruding element.

* * * * *